(12) United States Patent
Pekkarinen et al.

(10) Patent No.: US 7,898,821 B2
(45) Date of Patent: Mar. 1, 2011

(54) APPARATUS AND ARRANGEMENT FOR SHIELDING A LIGHT EMITTING DIODE AGAINST ELECTROSTATIC DISCHARGE

(75) Inventors: Ari Pekkarinen, Laukaa (FI); Pasi Saukonoja, Parantala (FI); Jari Jekkonen, Jyväskylä (FI)

(73) Assignee: Nokia Corporation, Espoo (FI)

( * ) Notice: Subject to any disclaimer, the term of this patent is extended or adjusted under 35 U.S.C. 154(b) by 1039 days.

(21) Appl. No.: 10/582,657

(22) PCT Filed: Nov. 24, 2004

(86) PCT No.: PCT/FI2004/005177
§ 371 (c)(1), (2), (4) Date: Jun. 12, 2006

(87) PCT Pub. No.: WO2005/057656
PCT Pub. Date: Jun. 23, 2005

(65) Prior Publication Data
US 2009/0262510 A1   Oct. 22, 2009

(30) Foreign Application Priority Data
Dec. 10, 2003   (FI) ..................................... 20035230

(51) Int. Cl.
H05K 9/00   (2006.01)
(52) U.S. Cl. ........... 361/816; 361/680; 361/682; 341/34; 345/169; 257/59
(58) Field of Classification Search ................... 361/816, 361/680, 682; 362/237; 341/34; 29/846; 345/169; 257/59; 438/26
See application file for complete search history.

(56) References Cited

U.S. PATENT DOCUMENTS

| | | | | |
|---|---|---|---|---|
| 3,843,851 A | * | 10/1974 | Harada et al. | 200/5 E |
| 3,869,637 A | * | 3/1975 | Usui | 313/500 |
| 3,881,921 A | * | 5/1975 | Frank | 430/53 |
| 5,060,595 A | * | 10/1991 | Ziv et al. | 118/722 |
| 5,105,238 A | * | 4/1992 | Nikaido et al. | 257/40 |
| 5,178,722 A | * | 1/1993 | Hoshino | 216/20 |
| 5,349,346 A | * | 9/1994 | Wu | 340/908 |
| 5,461,377 A | * | 10/1995 | Oono et al. | 341/22 |
| 5,696,372 A | * | 12/1997 | Grober et al. | 250/216 |
| 5,889,308 A | * | 3/1999 | Hong et al. | 257/355 |
| 5,977,718 A | * | 11/1999 | Christensen | 315/169.1 |
| 6,331,063 B1 | * | 12/2001 | Kamada et al. | 362/237 |
| 6,536,913 B1 | * | 3/2003 | Yajima et al. | 362/231 |

(Continued)

FOREIGN PATENT DOCUMENTS

JP        2001196638        7/2001

*Primary Examiner* — Jinhee J Lee
*Assistant Examiner* — Xiaoliang Chen
(74) *Attorney, Agent, or Firm* — Alfred A. Fressola; Ware, Fressola, Van Der Sluys & Adolphson LLP

(57) ABSTRACT

The invention relates to an apparatus and arrangement for shielding a light emitting diode against electrostatic discharges during usage. On a printed circuit board (103, 203) there is placed a light emitting diode (108, 208), and on the component side of the circuit board (103, 203), there is arranged a photoconductor layer (102, 202). In the photoconductor layer (102, 202), there is induced electroconductive material (110, 210), and the electroconductive material is connected to the ground plane (111) of the circuit board in order to conduct the electrostatic discharge from the photoconductor layer (102, 202) to the ground plane.

6 Claims, 1 Drawing Sheet

U.S. PATENT DOCUMENTS

| | | | |
|---|---|---|---|
| 6,648,530 B2 * | 11/2003 | Kamei et al. | 400/472 |
| 7,053,799 B2 * | 5/2006 | Yu et al. | 341/31 |
| 7,388,569 B2 * | 6/2008 | Agari et al. | 345/102 |
| 7,553,088 B2 * | 6/2009 | Nakajima | 385/64 |
| 2001/0049207 A1 * | 12/2001 | Sakata et al. | 439/66 |
| 2002/0113934 A1 * | 8/2002 | Aoki | 349/149 |
| 2002/0187570 A1 * | 12/2002 | Fukasawa et al. | 438/26 |
| 2003/0007448 A1 * | 1/2003 | Kamezaki et al. | 369/275.4 |
| 2003/0020064 A1 * | 1/2003 | Hashimoto et al. | 257/59 |
| 2003/0201983 A1 * | 10/2003 | Jokinen et al. | 345/169 |
| 2004/0067015 A1 * | 4/2004 | Nakajima | 385/33 |

* cited by examiner

APPARATUS AND ARRANGEMENT FOR SHIELDING A LIGHT EMITTING DIODE AGAINST ELECTROSTATIC DISCHARGE

CROSS REFERENCE TO RELATED APPLICATIONS

This application is for entry into the U.S. national phase under §371 for International Application No. PCT/FI2004/050177 having an international filing date of Nov. 24, 2004, and from which priority is claimed under all applicable sections of Title 35 of the United States Code including, but not limited to, Sections 120, 363 and 365(c), and which in turn claims priority to Finnish patent application 20035230 filed on Dec. 10, 2003.

TECHNICAL FIELD

The invention relates to an apparatus and arrangement for shielding a light emitting diode against electrostatic discharge during the use of said light emitting diode.

BACKGROUND OF THE INVENTION

A light emitting diode (LED) emits visible light, when electric current passes therethrough. The light emitted by a light emitting diode is not particularly bright. Typically the light is monochromatic, i.e. one light emitting diode emits one certain wavelength. The wavelengths emitted by light emitting diodes can vary from red, 700 nm, to blue-violet, 400 nm. Some light emitting diodes may emit in the infrared range, in which case the wavelength emitted by them can be 830 nm or more.

A pn-junction of a light emitting diode emits light, when electric current passes through the light emitting diode. The light emitting diode is composed of a p-type and an n-type semiconductor. Between the semiconductors, there is a so-called pn-junction, where the p-side has a negative charge and the electron-free holes serve as charge carriers, and the n-side has a positive charge and the free electrons serve as charge carriers. When a forward current is induced in a light emitting diode, so that the p-side is arranged at a high potential, and the n-side is arranged at a low potential, electrons flow to the pn-junction area from the n-side, and holes from the p-side. The free holes and electrons are annihilated, i.e. the electrons fill the free holes. This kind of transfer of electrons from a high-energy state to a lower-energy state releases energy. In a light emitting diode, the energy is released in the form of visible light.

Light emitting diodes have a low power consumption, and they are efficient in producing light energy. In addition, light emitting diodes have a long life. Therefore they are used in several practical applications, such as for example self-illuminating displays, number and dial plates, clocks, electronic calculators, speed displays of cars and signal lights. The pn-junction area of a light emitting diode can be wide, and it can be designed according to the application in question. The surface part to be arranged on top of a light emitting diode installed in a device must be made of a light permeable material, so that the light energy emitted by the light emitting diode permeates the surface part of the device and can be observed.

Light emitting diodes are sensitive to electrostatic discharge (ESD). Typically electrostatic discharge occurs when two different materials, one of which has a positive charge and the other has a negative charge, are set in mutual contact. The positively charged material has an electrostatic charge. When this type of electrostatic charge gets into contact with a certain other material, the charge is transferred, and there is created electrostatic discharge.

A remarkable quantity of thermal energy is released in an electrostatic discharge. If the electrostatic charge is discharged in a sensitive electric device, the heat released in the device during the discharge may melt, vaporize or otherwise damage the sensitive components of the device. An electrostatic discharge can damage the device so that while the device still works, in some of its elements or functions, there occur errors or irregularities deviant from the normal operation.

These kind of hidden effects are extremely difficult to observe, and they remarkably shorten the working life of the device. Many electronic devices are sensitive even to low-voltage electrostatic discharge. Therefore manufacturers attempt to avoid electrostatic discharge during the whole production process: during the manufacturing, testing, transport and processing steps. In addition, the products can be subjected to electrostatic discharge when they are being used, which means that the shielding of sensitive products must be taken into account already at the planning stage.

Sensitive electronic products, devices and components are typically packed in materials that shield the products against harmful charges. A product can be shielded mechanically by insulating it against possible external charges. Typically the insulation is carried out by leaving an insulation clearance between the product and the shielding element, said clearance being for example an insulating clearance of air. In practice, the product is put for instance in a thick plastic bag, so that an insulating layer of air is arranged between the product and the bag. This kind of insulation is generally not suited for products during their use, because the cover and the insulating layer may disturb the use or make it cumbersome, or it may even prevent some functions from being performed.

Another generally used shielding method is a metal box installed around the component to be shielded. A metal box provides a good and reliable shielding against electrostatic discharge. The same metal box can typically be used for other types of shielding, for example as an electromagnetic shielding. Metal boxes used for shielding are fairly heavy and expensive. In addition, metal boxes take up a lot of space, wherefore particularly in small devices their size and weight may turn out to be decisive factors. The installation of metal boxes must be planned as one separate step in the assembly process. The installation is precise work and makes the assembly work more difficult. Moreover, a metal box that is reliable as such, is not a feasible shielding for light emitting diodes, because the light emitted by a light emitting diode cannot permeate a metal box. Thus the metal box also insulates the light emitted by the light emitting diode, so that the light emitting diode becomes useless for illumination. Light emitting diodes are particularly sensitive to electrostatic discharge that occurs generally in the normal use of devices containing light emitting diodes.

SUMMARY OF THE INVENTION

One objective of the invention is to shield a light emitting diode against electrostatic discharge in a good and reliable manner. Another objective of the invention is to shield a light emitting diode against electrostatic discharge in an economic way. Yet another objective of the invention is to realize the shielding of a light emitting diode in a simple fashion. Yet another objective of the invention is to prevent drawbacks occurring in arrangements of the prior art.

The objective is achieved so that a light emitting diode arranged on a printed circuit board is shielded against electrostatic discharge by inducing electroconductive material in the photoconductor layer positioned on top of the light emitting diode, which electroconductive material is grounded to a ground plane of the circuit board in order to conduct the electrostatic discharge to the ground plane.

The invention is characterized by what is set forth in the independent claims. Other embodiments of the invention are described in the dependent claims.

On the surface of a light emitting diode according to an embodiment of the invention, there is induced electroconductive material that can be connected to the ground plane in order to conduct the electrostatic discharge to the ground plane through the electroconductive material. In a device according to an embodiment of the invention for shielding a component against electrostatic discharge, there is a light emitting diode, a photoconductor layer for conducting the light emitted by the light emitting diode, which photoconductor layer contains electroconductive material, and said electroconductive material can be connected to the ground plane for conducting electrostatic discharge from the photoconductor layer to the ground plane. In a method according to an embodiment of the invention for shielding a light emitting diode arranged on a circuit board against electrostatic discharge, in which method on the component side of the circuit board there is provided a photoconductor layer, electroconductive material is induced in the photoconductor layer, and the electroconductive material is connected to the circuit board ground plane in order to conduct electrostatic discharge from the photoconductor layer to the circuit board ground plane.

According to an embodiment of the invention, on a circuit board there is placed a light emitting diode, and on top of said light emitting diode, there is placed a photoconductor layer provided with an aperture, so that the light emitting diode is at least partly inside the photoconductor layer. As a location, the aperture arranged in the photoconductor layer, around the light emitting diode, is susceptible to static electric pulses coming from outside the device. In order to shield the light emitting diode placed in the aperture, electroconductive material is induced in the photoconductor layer, at least at the aperture edges, and the electroconductive material is grounded to the circuit board ground plane in order to conduct electrostatic discharge coming from outside the device to the ground plane. Thus the electrostatic discharge coming from outside is conducted to the electroconductive part of the photoconductor, from where it is conducted to the circuit board ground plane. Thus the light emitting diode is shielded against electrostatic discharges, because the discharges do not proceed to the light emitting diode, but they are conducted from the photoconductor to the ground plane. According to another embodiment, the whole outermost surface of the photoconductor layer, pointing away from the circuit board, is coated by an electroconductive material and grounded to the circuit board ground plane.

In case an electrostatic discharge should proceed to the light emitting diode, the discharge would break the light emitting diode. Consequently, an arrangement according to an embodiment of the invention shields a sensitive component without weakening the luminosity thereof. Apart from the fact that a pulse may break the light emitting diode, it may have hidden effects that are not immediately or directly apparent in the operation of the light emitting diode. For example, an electrostatic pulse may result in irregularities in the operation of a program or a device, or the mode information of a switch may be altered due to the effect of an electrostatic pulse. Also hidden interference is effectively prevented by means of the arrangement according to the invention. In addition, the shielding according to an embodiment of the invention can be used, apart from shielding a component, also for conducting light. The purpose of a photoconductor is, as the name indicates, to conduct illumination and light in general in a controlled manner to a certain place. By means of a conductor coating according to an embodiment of the invention, it also is possible to affect the conducting of the light emitted by the light emitting diode in a photoconductor.

Embodiments of the invention do not require any separate shielding components, but the shielding is permanently integrated for example in a plastic part or component of the device. In the embodiments of the invention, additional elements are completely avoided. When additional elements are not needed for realizing the shielding, the assembly step of the devices becomes remarkably easier, and a simpler structure is obtained for the device.

BRIEF DESCRIPTION OF THE DRAWINGS

The various embodiments of the invention are observed in more detail with reference to the appended drawings, where.

DETAILED DESCRIPTION

Figure 1:
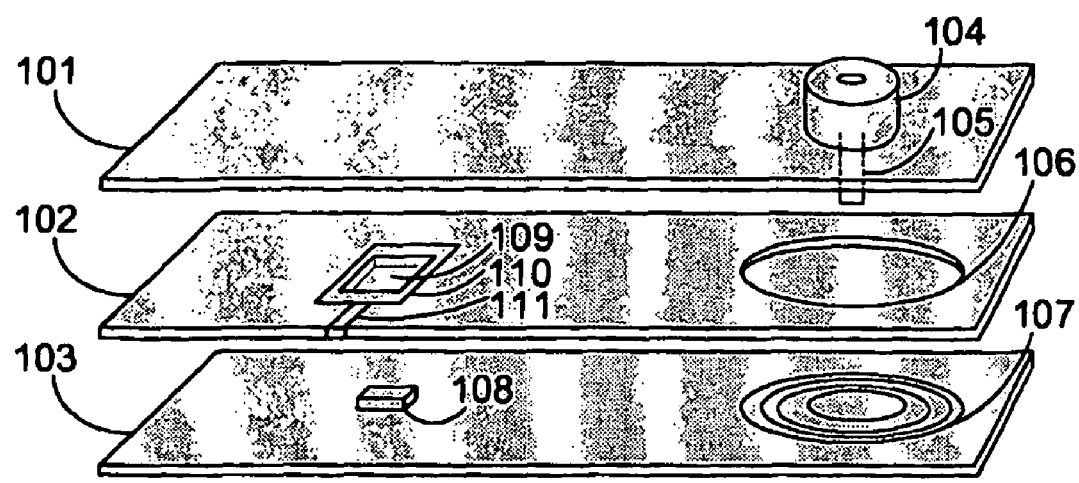
FIG. 1 illustrates an arrangement according to an embodiment of the invention.

In the drawings, there is observed, as an example of a shielding arrangement according to embodiments of the invention, the shielding of a light emitting diode used for illuminating a keyboard against external electrostatic pulses. For the sake of clarity, and for a better illustration of the details, the superimposed elements of the keyboard are in the drawing shown as separate elements. Respective numbers for corresponding parts are used in the embodiments of the drawings.

FIG. 1 illustrates a uniform keyboard element 101, a so-called keypad, which here includes, for illustrative reasons, only one key 104. There can be one or several keys, according to the embodiment in question. Underneath the keyboard element, there is a photoconductor layer 102, which is used for conducting light to a desired place on the keyboard element 101. Typically the places that should be illuminated are the locations of the keys 104. In addition, FIG. 1 illustrates a printed circuit board 103, where all electric connections are located. The circuit board 103 includes a light emitting diode 108 that illuminates the keyboard element 101 and particularly the key 104 by light conducted through the photoconductor layer 102.

In the embodiment of FIG. 1, the keyboard element 101 is formed of a uniform, transparent pad. The keys 104 can also be realized as separate elements. Typically the device also includes a cover element (not illustrated in FIG. 1), through which the keys 104 protrude via openings designed for them. Thus the surface of the device that is visible for the user is the cover element and the keycap, or generally several keycaps, forming that part of the key 104 that is projected through the cover element in order to make it possible for the user to feed in data. The keyboard element 101 located underneath the cover element, which keyboard element can thus also be compiled of several separate elements, is typically elastic. Generally the key 104 is provided with a projection 105, by means of which electric connections can be switched on the circuit board 103. The projection 105 is in contact with a predetermined location 107 of the circuit board 103 and generates the input signal proper responsive to the tapping of the key.

The keyboard element 101 according to an embodiment of the invention is transparent. The keyboard element 101 can be manufactured for instance of silicone, plastic or a mixture. A key made of transparent material can be illuminated by means of the light emitting diode provided on the circuit board 103. On the surface of the key 104, there can also be arranged an element made of a hard, rigid material, by means of which element a hard haptic feedback can be generated for the user. In case the keycap is made of a hard material impermeable to light, it is possible to illuminate for example the edge parts of the key 104.

Generally the keyboard element 101 is porous. In order to facilitate the movement of the key 104, the keyboard element 101 is typically elastic. As an alternative, the motion of the key 104 can be realized by means of a spring or a corresponding element that enables the returning motion of the key. During usage, the keyboard element 101 wears off and becomes fragile. Inside the porous keyboard element 101, there are fairly easily formed channels where interference can freely proceed. A worn keyboard element 101 easily conducts electrostatic pulses coming from outside, through the key 104. In case this kind of an electrostatic pulse can proceed through the keyboard element 101 to the light emitting diode, the light emitting diode is broken or at least damaged. Electrostatic pulses can also cause hidden damages or irregularities that often are extremely difficult to observe.

The material of the photoconductor layer 102 is typically clear and transparent. The task of the photoconductor layer 102 is to conduct light from the light-emitting component of the circuit board, such as the light emitting diode 108, to the target to be illuminated, in this case to the key 104. The photoconductor layer 102 is placed on the component side of the circuit board 103, i.e. on that side of the circuit board 103 where the components soldered on the circuit board 103 are located. In an embodiment of FIG. 1, in the photoconductor layer 102 there is illustrated an aperture 106, through which the projection 105 of the key 104 is pressed on the circuit board 103 when tapping the key 104. The projection 105 creates desired electric connections on the circuit board 103. In this embodiment, the photoconductor includes an aperture 109 for the light emitting diode 108 located on the circuit board 103.

On the circuit board 103, there are realized the electric connections proper, and various components are located there. FIG. 1 illustrates a light emitting diode 108 and a key switch 107. The key switch 107 is for example a metallic element, by which the couplings fed in through the key are electrically realized. FIG. 1 illustrates a so-called key bubble 107 that can be a kind of a glue-on element for switching the key functions. Essentially the key switch 107 is activated when the projection 105 of the key 104 is put in contact with the key switch 107. The circuit board can be made of a flexible or a rigid material. From the point of view of the various embodiments of the invention, the type of the employed circuit board 103 is not essential, but all known printed circuit board types are possible when applying the embodiments of the invention.

In FIG. 1, the photoconductor layer 102 is provided with an aperture 109 for the light emitting diode 108. During the assembly step, the photoconductor layer 102 is arranged on the component side of the circuit board 103. The light emitting diode 108 placed on the circuit board 103 is arranged in the aperture 109 of the photoconductor layer, partly inside the photoconductor layer 102. The photoconductor layer 102 conducts the light emitted by the light emitting diode 108.

The electric components of the circuit board 103 must be shielded against electric pulses. Particularly the shielding of the light emitting diode 108 partly placed inside the photoconductor layer 102 is a demanding task, because the light emitting diode is subjected to the electric discharges emitted through air or through the photoconductor layer 102. In addition, the light emitting diode 108 cannot be for instance covered in a box, because this would prevent it from performing its original task, i.e. emitting light.

According to an embodiment of the invention, in the surroundings of the aperture 109 arranged in a clear photoconductor layer 102 for the light emitting diode 108, there is induced electroconductive material 110. Typically around the aperture 109, there is formed an electroconductive area 110 by metal coating the surface of the photoconductor layer 102 surrounding the aperture 109 in a given area. According to an embodiment, the induced electroconductive area 110 is grounded via a strip 111 to the ground plane of the circuit board 103. An electrostatic pulse entering the device from the outside, typically via the key 104, now proceeds through the keyboard element 101 to the photoconductor layer 102. In the photoconductor layer 102, the electrostatic pulse is conducted to the electroconductive area 110, from where it is conducted 111 to the ground plane of the circuit board. The electrostatic pulse cannot damage the light emitting diode 108, when it is led directly from the photoconductor layer 102 to the ground plane of the circuit board 103.

The method of grounding the induced electroconductive area according to an embodiment of the invention is not essential from the point of view of the invention, but the grounding can be realized in many different ways. When using a hard, rigid circuit board, on the bottom surface of the photoconductor layer there can be created a kind of a protuberance, a pimple, through which the electroconductive area of the photoconductor layer is connected to the ground plane of the circuit board. In case the circuit board is elastic, there can be used for instance a spring structure in order to connect the electroconductive area of the photoconductor layer to the ground plane of the circuit board. The induction of electroconductive substance to the surface of the photoconductor layer according to the invention can be realized for instance by metallizing or coating the surface of the photoconductor layer chemically or electrochemically, or by using an electroconductive film that covers the surface of the photoconductor layer either completely or partly. When the film made of an electroconductive material is attached to the surface of the photoconductor layer, the photoconductor layer and the film attached thereto form a uniform element. Particularly in the assembly step, said integrated element is installed in the device in one part, in one assembly step. The film material can be for instance aluminum. The electroconductive material of the photoconductor is connected by the electroconductive material to the same electric potential as the ground plane of the circuit board.

Figure 2:
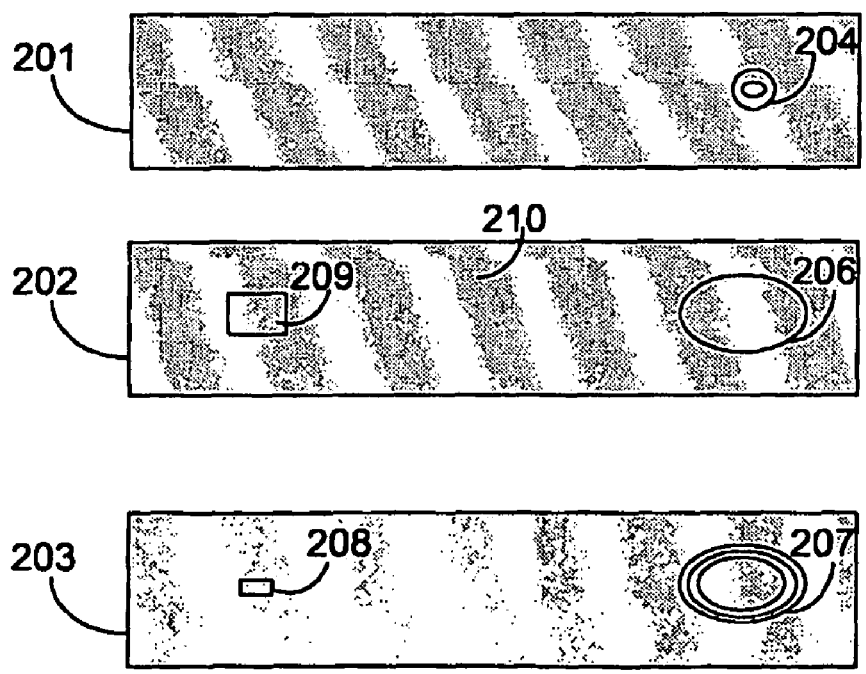
FIG. 2 illustrates an arrangement according to another embodiment of the invention.

In the embodiment illustrated in FIG. 2, there is shown, in a top-view illustration, a keyboard element 201, a photoconductor layer 202 and a circuit board 203. In the assembly step, said elements are set on top of each other, so that on top of the circuit board 203, there is set the photoconductor layer 202, and topmost the keyboard element 201. In the final product, on top of the keyboard element there is typically also the cover element that is not illustrated in FIG. 2. The keyboard element 201 is a uniform, padlike element, of which in this embodiment there is illustrated one key 204. Underneath the key, the photoconductor layer 202 is provided with an aperture 206, through which the key 204 can be pressed to the corresponding connection spot 207 on the circuit board 203 in order to create the electric function caused by the tapping of the key.

In order to prevent undesired electrostatic discharges from proceeding from the keyboard element 201 to the circuit board 203, or particularly to the light emitting diode 208 to be shielded, located on the circuit board, in the embodiment of FIG. 2 the whole upper surface 210 of the photoconductor layer, positioned against the keyboard element 201, is coated by electroconductive material. According to an embodiment, the surface of the photoconductor layer is metal coated by some electroconductive material, and further the metal coated electroconductive surface is grounded to the ground plane of the circuit board 203 by some suitable method. The metallizing of the photoconductor layer according to the embodiments conducts possible electrostatic pulses directly to the ground plane of the circuit board 203, in which case the pulses do not disturb the function of the light emitting diode 108, or other components soldered on the circuit board 203.

On the outermost surface of the photoconductor layer, which surface is positioned against the keyboard element, there is typically placed a plastic film that is impermeable to light. The plastic film guides the light conducted in the photoconductor layer to the desired locations to be illuminated, and thus prevents light from proceeding to undesired locations. The shielding of a light emitting diode according to an embodiment of the invention, by inducing a layer of electroconductive material on the whole area of the surface of the photoconductor layer, serves both as a shielding and as a light conductor, in corresponding fashion as a typically used plastic film. An electroconductive material that is impermeable to light can thus serve both as a shielding against electrostatic pulses and as a surface guiding the light. Thus the proceeding of the light emitted by the light emitting diode can be guided in a controlled manner in the photoconductor layer by means of a shielding layer induced according to an embodiment of the invention. In keypad structures, the only locations that should be illuminated are typically the keycaps, in order to make them better visible for the user. In that case the light is conducted, along the photoconductor layer, to the key locations of the keyboard element. Also the mechanical shapes of the elements affect the proceeding of the light, and to the conducting of the light from the light emitting diode to the outer surface of the device.

According to some embodiments of the invention, the expenses of the metallizing are affected even more by the metal coating process itself, than by the quantity of the material to be induced. When the device to be shielded includes several keys, it is typically more advantageous to induce the electroconductive material on the whole surface area of the photoconductor layer than to carry out the inducing locally, separately for each light emitting diode aperture. On the other hand, for example in the case of single signal lights, the metal coating of a large area is often useless. In practice, there is always applied the embodiment that is best suited for the application in question. The shielding according to the embodiments of the invention is particularly suited for keypads, such as the keypad of a mobile phone. In addition, the arrangement according to the embodiments can be applied for various signal lights, pressing buttons and any kind of devices using light emitting diodes for illumination. Typically on top of a light emitting diode, there is provided a surface layer, such as for example a photoconductor layer, a keypad or a corresponding permeable layer. The shielding according to an embodiment of the invention can be integrated in an element located on top of the light emitting diode, such as a keypad. The electroconductive material integrated in an element of the device is further conducted by electroconductive material typically to the ground plane of that circuit board on which the light emitting diode to be shielded is located. Thus the grounded area conducts possible electrostatic pulses directly to the ground plane of the circuit board.

In an arrangement according to an embodiment of the invention, there are not needed separate elements for realizing the shielding, but the shielding arrangement is permanently integrated in an element located above the light emitting diode. Thus the assembly of the devices becomes easier, because the number of separate elements is reduced. When there is a smaller number of elements, they also take up less space, and the total weight of the device is reduced.

The invention claimed is:

1. An apparatus for shielding a component against electrostatic discharge comprising a light emitting diode placed on a printed circuit board and a photoconductor layer for conducting light emitted by the light emitting diode, wherein the photoconductor layer includes an electroconductive material, and that the electroconductive material is connectable to a ground plane in order to conduct electrostatic discharges from the photoconductor layer to the ground plane, further wherein the photoconductor layer is provided with a first aperture that extends through said photoconductor layer, the light emitting diode at least partly placed in the first aperture, inside the photoconductor layer, and the photoconductor layer also provided with the electroconductive material at least around the edges of the first aperture, and further comprising a key having a projection extending through a second aperture provided on said photoconductor layer, said projection configured to press on said circuit board.

2. The apparatus according to claim 1, wherein the photoconductor layer has a surface and wherein the electroconductive material of the photoconductor layer is integrated as a layer of the electroconductive material for shielding components against electrostatic pulses and for conducting the light emitted by the light emitting diode in the photoconductor layer.

3. The apparatus according to claim 1, wherein the light emitting diode is placed on a printed circuit board, the photoconductor layer is placed on the component side of the circuit board, and the electroconductive material is placed on that side of the photoconductor layer that faces away from the circuit board and the electroconductive material is connectable to the ground plane of the circuit board.

4. The apparatus according to claim 1, wherein the electroconductive material is metal, and it is connected to the ground plane by the electroconductive material.

5. The apparatus according to claim 1, wherein the electroconductive material is realized on the surface of the photoconductor layer by an electroconductive film, or by inducing chemically or electrochemically.

6. The apparatus according to claim 1, further comprising a keypad comprising said key, wherein the light emitting diode on said circuit board is configured to illuminate the keypad, and wherein the photoconductor layer is configured to conduct the light emitted by the light emitting diode to said key of the keypad.

* * * * *